(12) United States Patent  
Chen et al.

(10) Patent No.: US 9,030,022 B2  
(45) Date of Patent: May 12, 2015

(54) PACKAGES AND METHODS FOR FORMING THE SAME

(75) Inventors: Meng-Tse Chen, Changzhi Township (TW); Chun-Cheng Lin, New Taipei (TW); Yu-Peng Tsai, Taipei (TW); Hsiu-Jen Lin, Zhubei (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 256 days.

(21) Appl. No.: 13/280,157

(22) Filed: Oct. 24, 2011

(65) Prior Publication Data

US 2013/0099385 A1   Apr. 25, 2013

(51) Int. Cl.
*H01L 23/48* (2006.01)
*H01L 23/498* (2006.01)
*H01L 23/31* (2006.01)
*H01L 23/00* (2006.01)
*H01L 25/10* (2006.01)

(52) U.S. Cl.
CPC ...... *H01L 23/49811* (2013.01); *H01L 23/3128* (2013.01); *H01L 23/562* (2013.01); *H01L 24/13* (2013.01); *H01L 24/16* (2013.01); *H01L 24/32* (2013.01); *H01L 24/73* (2013.01); *H01L 24/81* (2013.01); *H01L 24/92* (2013.01); *H01L 25/105* (2013.01); *H01L 2224/131* (2013.01); *H01L 2224/13147* (2013.01); *H01L 2224/16225* (2013.01); *H01L 2224/32225* (2013.01); *H01L 2224/73204* (2013.01); *H01L 2224/81447* (2013.01); *H01L 2224/92125* (2013.01); *H01L 2225/1023* (2013.01); *H01L 2225/1058* (2013.01); *H01L 2924/1431* (2013.01); *H01L 2924/1432* (2013.01); *H01L 2924/1434* (2013.01); *H01L 2924/15192* (2013.01); *H01L 2924/15311* (2013.01); *H01L 2924/15331* (2013.01); *H01L 2924/18161* (2013.01); *H01L 2924/3511* (2013.01); *H01L 23/49827* (2013.01)

(58) Field of Classification Search
CPC ............. H01L 2224/16145; H01L 23/481; H01L 25/0657; H01L 2924/3511
USPC .................................... 257/773, 774
See application file for complete search history.

(56) References Cited

U.S. PATENT DOCUMENTS

2011/0149493 A1* 6/2011 Kwon et al. ............. 361/679.02

* cited by examiner

*Primary Examiner* — Douglas Menz
(74) *Attorney, Agent, or Firm* — Slater & Matsil, L.L.P.

(57) ABSTRACT

A device includes a package component having conductive features on a top surface, and a polymer region molded over the top surface of the first package component. A plurality of openings extends from a top surface of the polymer region into the polymer region, wherein each of the conductive features is exposed through one of the plurality of openings. The plurality of openings includes a first opening having a first horizontal size, and a second opening having a second horizontal size different from the first horizontal size.

20 Claims, 7 Drawing Sheets

PACKAGES AND METHODS FOR FORMING THE SAME

BACKGROUND

In a conventional package-on-package (PoP) process, a top package, in which a first device die is bonded, is bonded to a bottom package. The bottom package may also have a device die packaged therein. By adopting the PoP process, the integration level of the packages may be increased.

Since each of the top package and the bottom package includes different materials that have different coefficients of thermal expansion (CTEs), after the formation of the top package and the bottom package, warpage may occur in either or both of the top and bottom packages. A warpage can be a positive warpage, wherein the central portion of the package is higher than the edge portions. Conversely, a warpage can be a negative warpage, wherein the central portion of the warpage is lower than the edge portions. After the bonding of the top and the bottom packages, cold joints may occur as a result of the warpage, and some of the joints may fail. The situation is worsened when the warpage of the top package does not match the warpage of the bottom package. For example, when the top package has a positive warpage and the bottom package has a negative warpage, or the top package has a negative warpage and the bottom package has a positive warpage, the chance of the occurrence of the cold joints increases.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A package and the method of forming the same are provided in accordance with various embodiments. The intermediate stages of forming the packages are illustrated. The variations of the embodiments are discussed. Throughout the various views and illustrative embodiments, like reference numbers are used to designate like elements.

Figure 1:
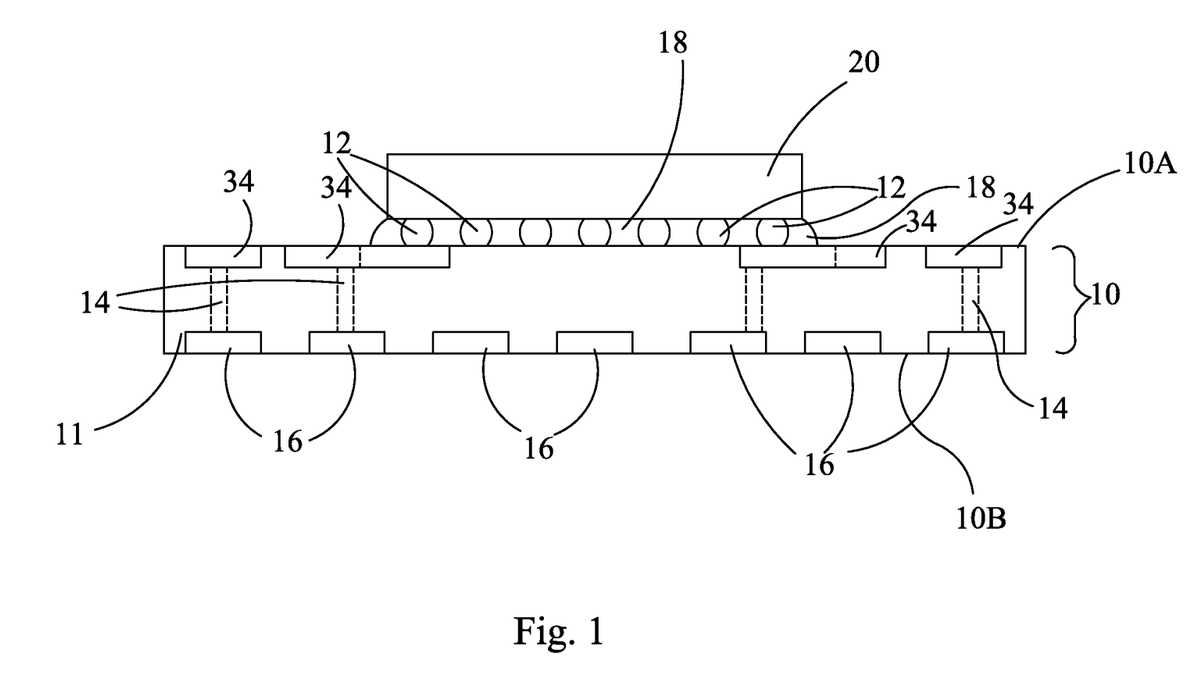
FIGS. 1 through 6 are cross-sectional views and a top view of intermediate stages in the manufacturing of a package in accordance with various embodiments.

Referring to FIG. 1, package component 10 is provided. In an embodiment, package component 10 comprises an interposer. In alternative embodiments, package component 10 comprises a package substrate. Package component 10 may comprise substrate 11 that is formed of a semiconductor material, such as silicon, silicon germanium, silicon carbon, gallium arsenide, or other commonly used semiconductor materials. Alternatively, substrate 11 is formed of a dielectric material. Substrate 11 may also be a laminate substrate which includes laminated dielectric films. Package component 10 is configured to electrically couple connectors 12 on first surface 10A to conductive features 16 on second surface 10B, wherein surfaces 10A and 10B are opposite surfaces of package component 10. In some embodiments, connectors 12 may include conductive features such as solder balls, metal pillars, under-bump-metallurgies, and/or the like. Alternatively, connectors 12 include metal pillars and adjoining solder regions. Conductive features 16 may be metal pads, for example. Package component 10 may include metal lines/vias 14 therein, and may also include through-vias formed in substrate 11.

Package component 20 is bonded to package component 10 through connectors 12. Package component 20 may be a die, and hence is alternatively referred to as die 20 herein after, although it may also be another type of package component such as a package. Die 20 may be a device die comprising integrated circuit devices, such as transistors, capacitors, inductors, resistors (not shown), and the like, therein. Furthermore, die 20 may be a logic die comprising core circuits, and may be, for example, a center computing unit (CPU) die, a graphic die, or a memory die. The bonding of die 20 to connectors 12 may be a solder bonding or a direct metal-to-metal bonding (such as copper-to-copper bonding). Underfill 18 may be dispensed into the gaps between die 20 and package component 10.

Figure 2:
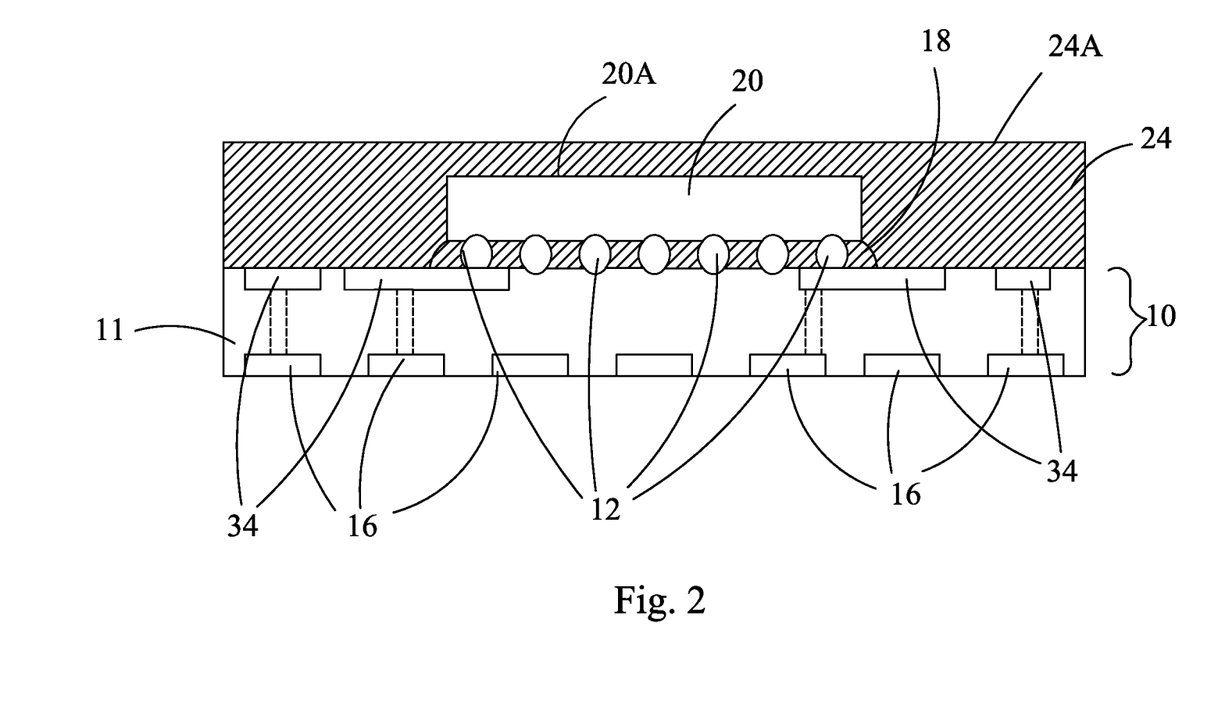

Referring to FIG. 2, polymer 24 is applied on die 20 and package component 10. In an exemplary embodiment, polymer 24 comprises a molding compound, and hence is referred to as molding compound 24 hereinafter, although it may also be formed of other materials such as molding underfill (MUF), epoxy, or the like. Molding compound 24 may be in contact with the top surface and the edges of die 20, and may be in contact with the top surface of package component 10. Molding compound 24 may be molded onto die 20 and package component 10 using, for example, compressive molding or transfer molding. Top surface 24A of molding compound 24 may be higher than top surface 20A of die 20, and die 20 may be fully encapsulated in molding compound 24. Optionally, a grinding may be performed to remove the portions of molding compound 24, which portions are over top surface 20A of die 20, and hence top surface 20A is exposed, and is level with top surface 24A of molding compound 24.

Figure 3:
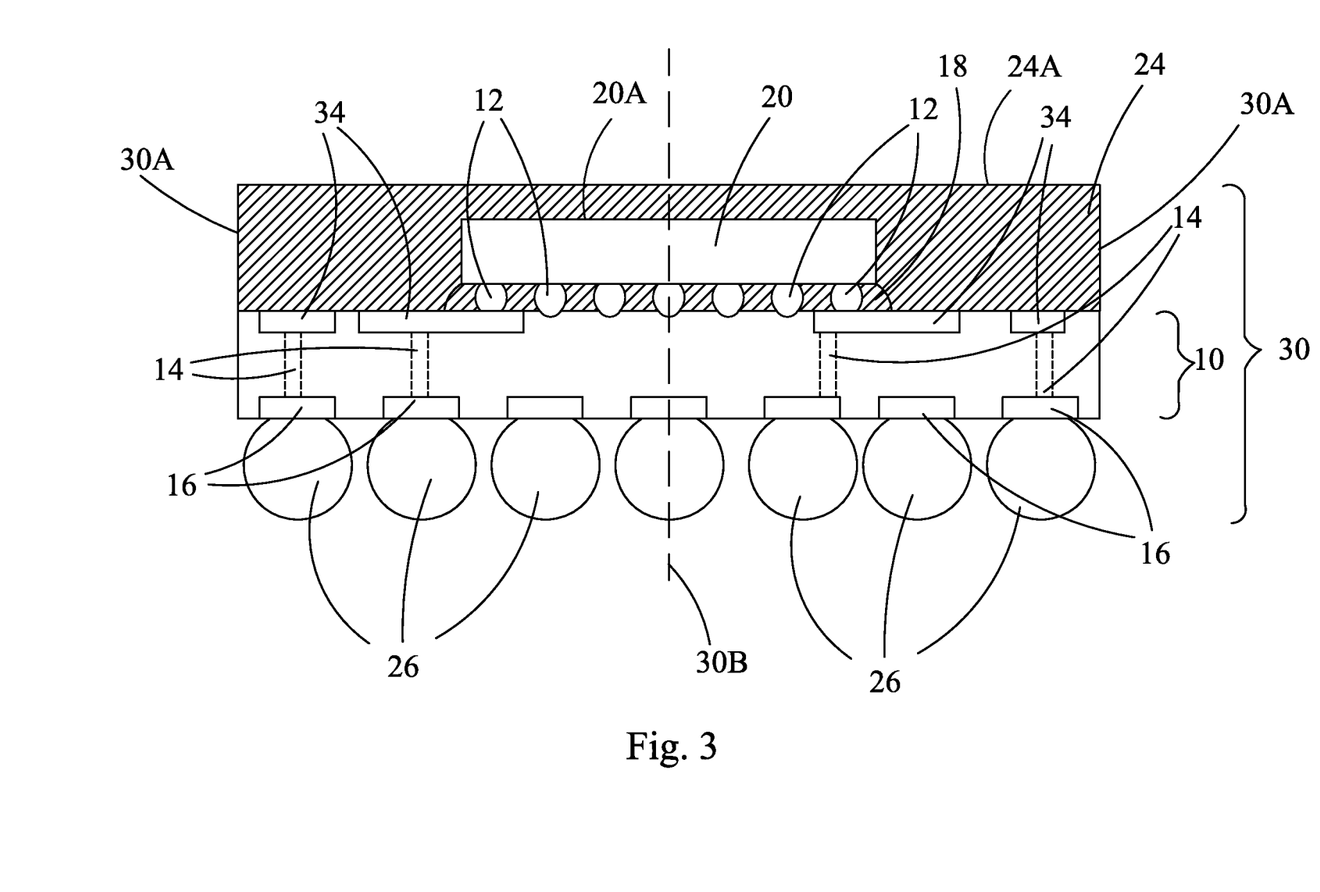

In FIG. 3, connectors 26 are formed on conductive features 16, and may be electrically coupled to connectors 12 through the connections such as metal lines/vias 14. Connectors 26 and die 20 may be on opposite sides of package component 10. Connectors 26 may be solder balls, which are placed on conductive features 16. A reflow is performed on solder balls 26. Bottom package 30, which is also referred to as a package component, is thus formed. Bottom package 30 includes edges 30A and center 30B, which is in the middle of edges 30A. Center 30B may also be the center of package component 10.

Figure 4A:
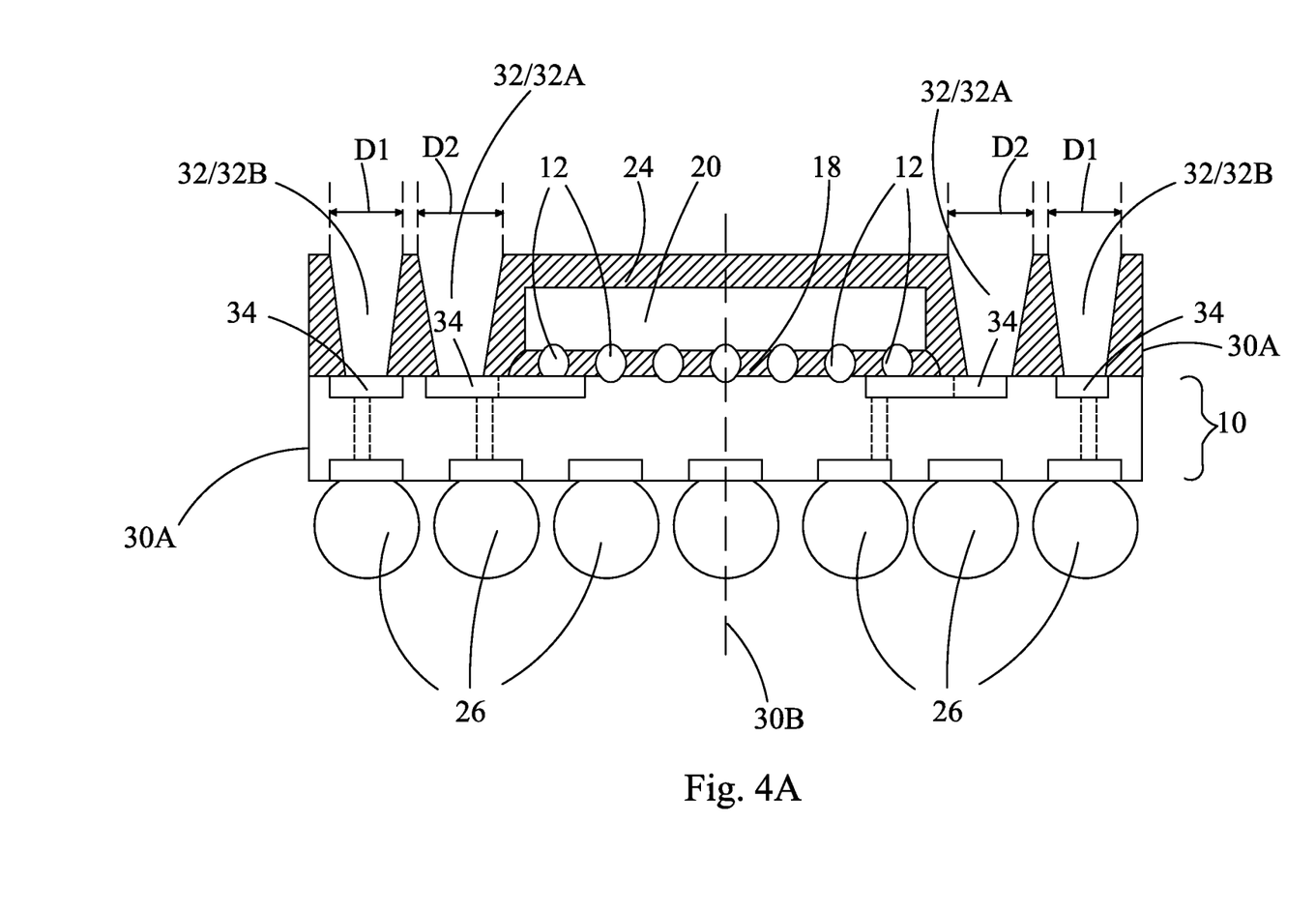

FIG. 4A illustrates the formation of openings 32 in molding compound 24. Openings 32 may be formed through drilling, etching, or the like. Accordingly, conductive features 34 on the top surface of package component 10 are exposed through openings 32. Conductive features 34 may be metal pads, and may be electrically coupled to connectors 12 and/or connectors 26. Opening 32 comprises inner openings 32A and outer openings 32B, wherein outer openings 32B are farther away from center 30B of package 30 (which may also be the center of package component 10) than inner openings 32A. Openings 32 have a plurality of horizontal sizes such as D1 and D2, which are different from each other, wherein horizontal sizes D1 are the sizes of outer openings 32B, while horizontal sizes D2 are the sizes of inner openings 32A. In some embodiments, horizontal size D1 is smaller than horizontal size D2, for example, smaller than about 90 percent or 80 percent D2. Horizontal size D1 may also be between about 50 percent D2 and about 90 percent D2. In alternative embodiments, horizontal size D2 is smaller than horizontal size D1, and smaller than about 90 percent or 80 percent D1, or may be between about 50 percent and 90 percent D1.

Figure 4B:
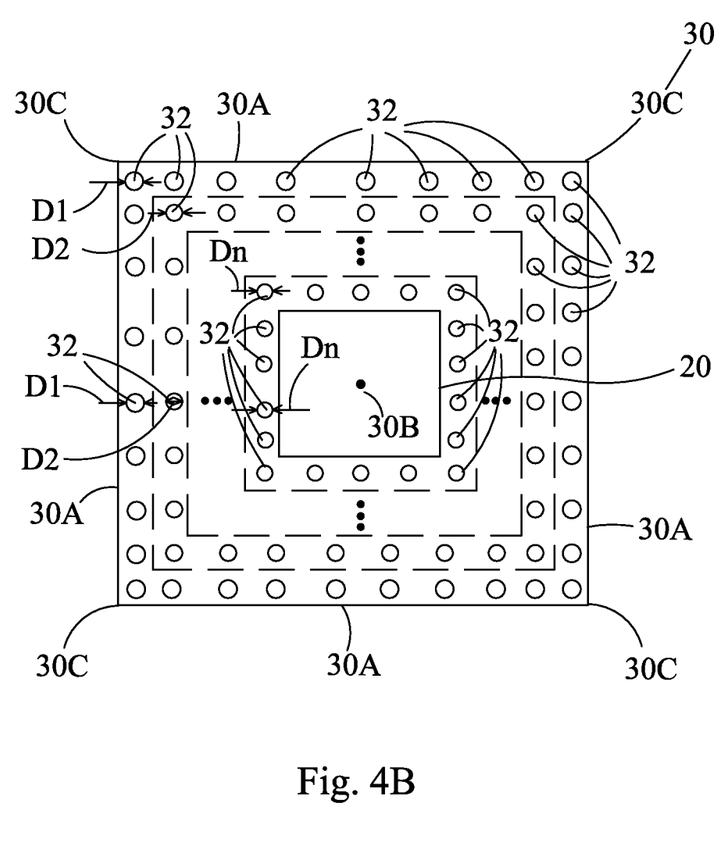

FIG. 4B illustrates a top view of package 30 in accordance with exemplary embodiments. In the top view, package 30 includes a plurality of ring-shaped regions, which are schematically illustrated as the regions between neighboring dashed rings. The inner ones of the plurality of ring-shaped regions are encircled by outer ones of the plurality of ring-shaped regions. In some embodiments, the horizontal sizes of openings 32 are related to which ring-shaped regions they belong to. For example, openings 32 in a same one of the plurality of ring-shaped regions may have a same horizontal size, and openings 32 in different ones of the plurality of ring-shaped regions may have different (or the same) horizontal sizes. Alternatively stating, openings 32 may be considered as aligned to a plurality of rings that encircles center 30B. From outer rings that are closer to edges 30A and/or corners 30C of package 30 to the inner rings that are closer to center 30B, the horizontal sizes are denoted as D1, D2 ... Dn, wherein D1 is the horizontal size of openings 32 in the outmost ring, and Dn is the horizontal size of openings 32 in the innermost ring. Integer n may be equal to 3, 4, 5, or any integer greater than 5, depending on the number of openings 32 and the total number of different horizontal sizes of openings 32 in package 30.

It is noted that although the top-view shape of openings 32 are round, and hence horizontal sizes D1 through Dn are diameters, openings 32 may have other top view shapes such as square, rectangle, hexagon, octagon, or the like, and horizontal sizes D1 through Dn may be the maximum horizontal sizes of openings 32. Furthermore, in the embodiments wherein the sidewalls of openings 32 are slanted, either the top sizes or the bottom sizes (as in FIG. 4A) of openings 32 may be used for comparison purpose, as long as all the horizontal sizes are measured using the same standard.

In some embodiments, the horizontal sizes Dn ... D2, D1 of openings 32 in outer ring-shaped regions that are closer to edges 30A and corners 30C are smaller than the horizontal sizes of openings 32 in the inner ring-shaped regions that are closer to center 30B, and each of the outer ring-shaped regions may have a horizontal size equal to or smaller than the horizontal sizes of openings 32 in the inner ring-shaped regions. For example, the relationship Dn> ... >D2>D1 may exist, although the horizontal sizes of openings 32 in some neighboring ring-shaped regions may be equal to each other. Alternatively, each of openings 32 in outer ring-shaped regions may have a horizontal size equal to or greater than the horizontal sizes of openings 32 in the inner ring-shaped regions. For example, the relationship Dn< ... <D2<D1 may exist, although the horizontal sizes of openings 32 in some neighboring ring-shaped regions may be equal to each other.

Figure 5:
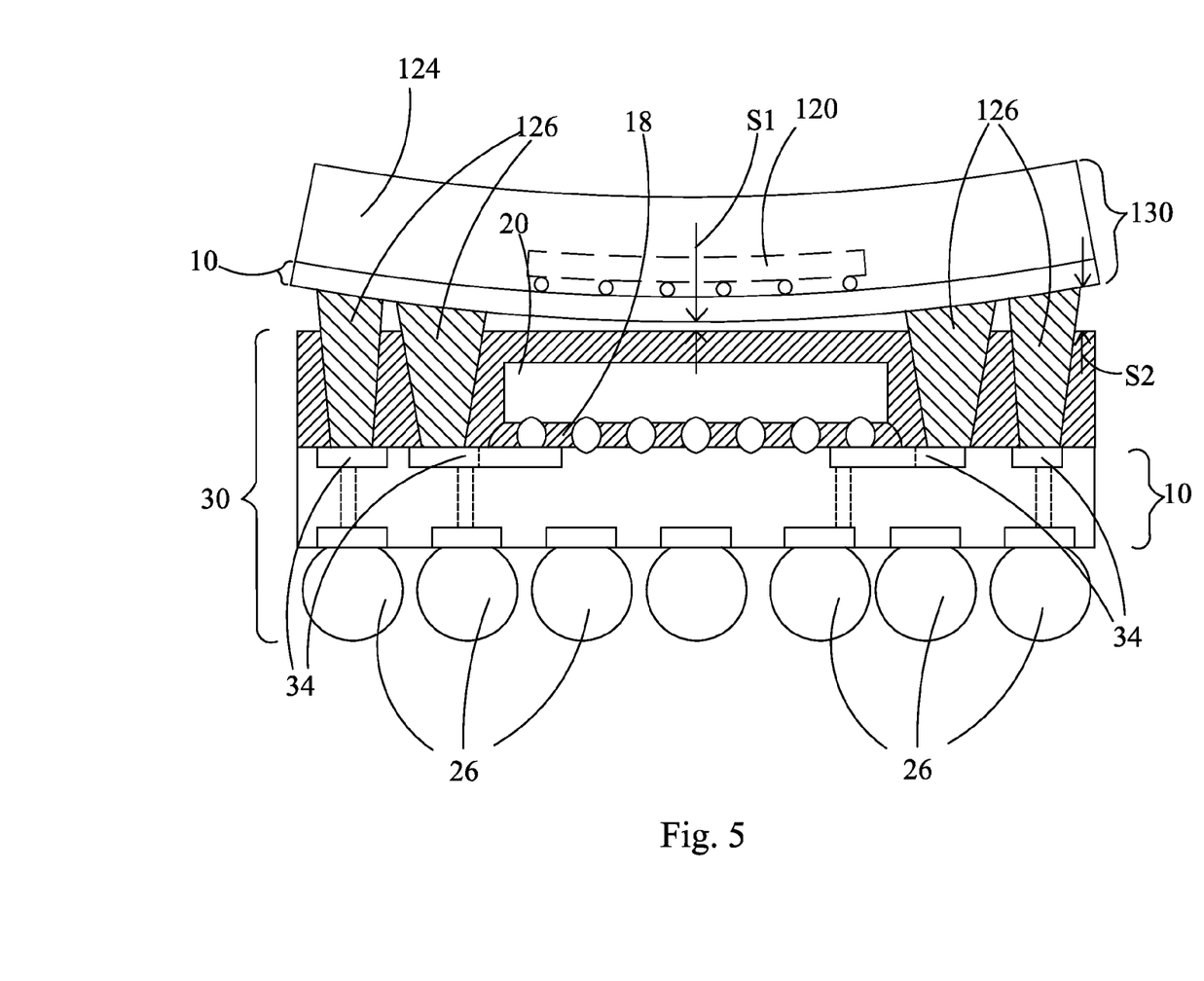
Figure 6:
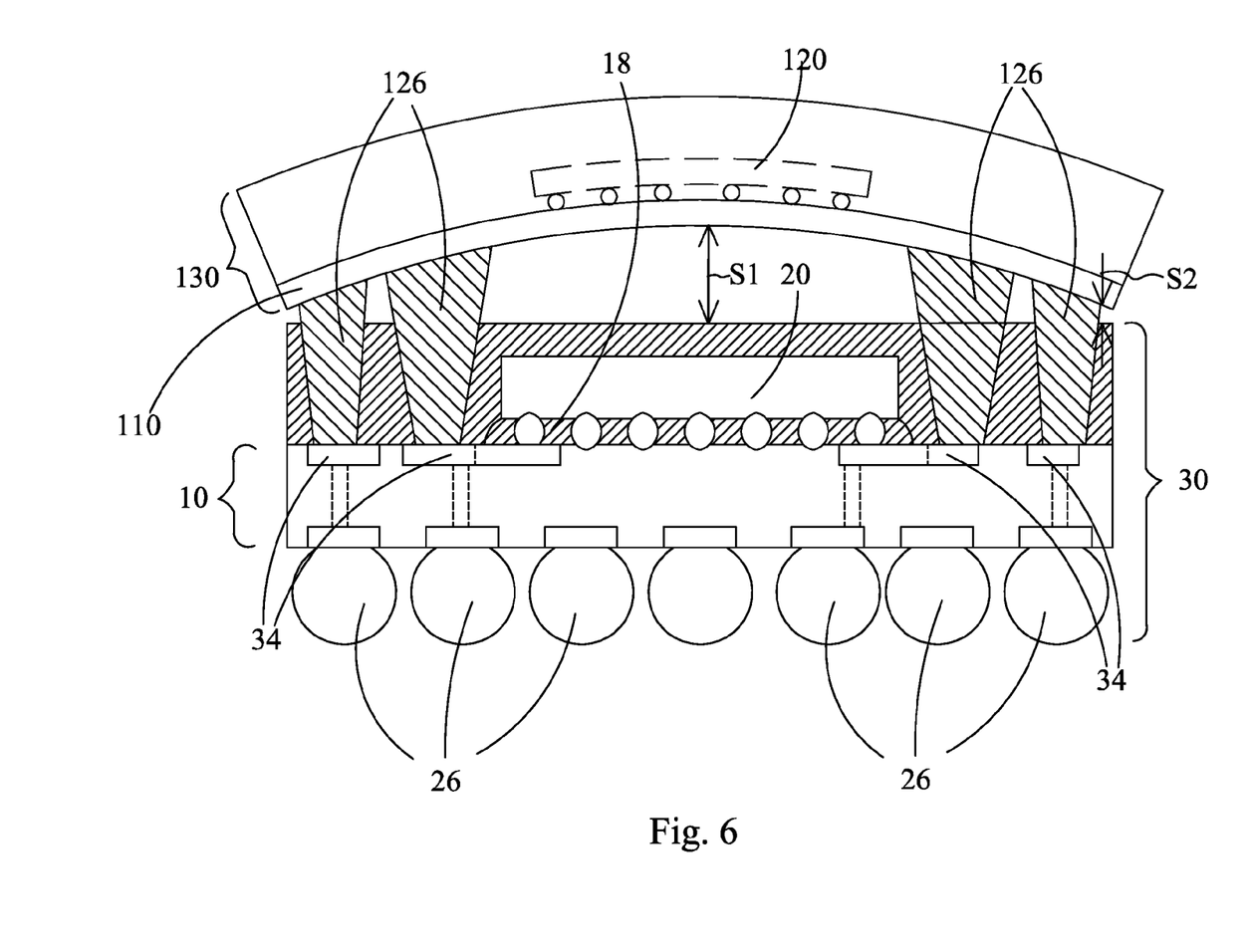

FIGS. 5 and 6 illustrate the bonding of package component 130 to package component 30. The cross-sectional view of package component 130 is illustrated. In an embodiment, package component 130 is also a package, which may include package component 110 and die 120 bonded on package component 110, and molding compound 124 formed on die 120. Die 120 may be a device die, and package component 110 may be an interposer, a package substrate, or the like. In alternative embodiments, package component 130 may be a device die. Package component 130 may have connectors 126 at the bottom surface. Connectors 126 may also be in various forms including solder therein, and may be solder balls, metal pillars and solder caps thereon, or the like.

FIGS. 5 and 6 also illustrate the bonding of package component 30 and 130, wherein connectors 126, whose positions are designed to align to the positions of openings 32 (FIG. 4A), are bonded to conductive features 34 in package 30. FIG. 5 illustrates that package components 30 and 130 have a negative warpage, which means that central spacing S1 is smaller than edge spacing S2. Central spacing S1 is the spacing between the portions of package components 30 and 130 that are close to the centers of package components 30 and 130, while edge spacing S2 is the spacing between the portions of package components 30 and 130 that are close to the edges of package components 30 and 130. It is noted that although FIG. 5 illustrates that package component 130 has a negative warpage and package component 30 is substantially straight, there may be other scenario, in which each of package components 30 and 130 may have a positive warpage, a negative warpage, or may be substantially flat. Throughout the description, regardless of the warpage of individual ones of package components 30 and 130, as long as spacing S1 is smaller than spacing S2, package components 30 and 130 in combination are referred to as having a negative warpage.

In FIG. 5, cold joints are more likely to occur at outer openings 32 if all openings 32 (filled by connectors 126, please also refer to FIG. 4A) have the same size. In the embodiments, if the negative warpage is going to occur to the bonded package components 30 and 130, the sizes of inner openings 32 are designed to be larger than the sizes of the outer openings 32. Accordingly, inner openings 32 may accommodate more solder, and it is easier for package components 30 and 130 to have inner spacings such as S1 smaller than outer spacings such as S2. Accordingly, the inner parts of package component 130 may be close to package component 30, and the chance of the occurrence of the cold joint in outer openings 32 is reduced.

FIG. 6 illustrates the bonding of package component 30 and 130, wherein package components 30 and 130 have a positive warpage, which means that central spacing S1 is greater than edge spacing S2. It is noted that although FIG. 6 illustrates that package component 130 has a positive warpage and package component 30 is substantially straight, there may be other scenario in which each of package components 30 and 130 may have a positive, negative warpage or substantially flat. Throughout the description, regardless of the warpage statuses of individual package components 30 and 130, as long as central spacing S1 is greater than edge spacing S2, package component 30 and 130 in combination are referred to as having a positive warpage.

In FIG. 6, cold joints are more likely to occur at inner openings 32 (filled by connectors 126, please also refer to FIG. 4A) if all openings 32 have the same size. In the embodiments, if the positive warpage is going to occur to the bonded package components 30 and 130, the sizes of inner openings 32 are designed to be smaller than the sizes of the outer openings 32. Accordingly, outer openings 32 may accommodate more solder, and it is easier for package components 30 and 130 to have smaller outer spacings such as S2 than inner spacings such as S1. Accordingly, the outer parts of package component 130 may be close to package component 30, and the chance of the occurrence of the cold joint in inner openings 32 is reduced.

In the embodiments, before openings 32 are formed in package 30 (FIG. 4), an evaluation may be made to determine the warpage status of the bonded package components 30 and 130. In the evaluation, the profiles of packages 30 and 130 are evaluated to determine whether package components 30 and 130, after bonded, will have a positive or a negative warpage. The evaluation may also be made through experiments by bonding sample package components 30 and 130. If a negative warpage will be resulted, then the horizontal sizes of inner openings 32 are designed to be greater than the horizontal sizes of outer openings 32. Conversely, if a positive warpage will be resulted, then the horizontal sizes of inner openings 32 are designed to be smaller than the horizontal sizes of outer openings 32. If, however, no warpage will occur to the bonded package 30 and package component 130, openings 32 throughout an entirety of package 30 may have substantially a same size. The scenario of no warpage may include the situation that both package 30 and package component 130 have no warpage, or both package 30 and package component 130 warp in the same direction and have substantially the same curvature. By adjusting the sizes of openings 32 in the bottom package 30, the likelihood of cold joint may be reduced.

In accordance with embodiments, a device includes a package component having conductive features on a top surface, and a polymer region molded over the top surface of the first package component. A plurality of openings extends from a top surface of the polymer region into the polymer region, wherein each of the conductive features is exposed through one of the plurality of openings. The plurality of openings includes a first opening having a first horizontal size, and a second opening having a second horizontal size different from the first horizontal size.

In accordance with other embodiments, a device includes a package, which includes a first package component comprising conductive features on a top surface of the first package component, a device die bonded to the top surface of the first package component, and a molding compound molded on the top surface of the first package component, wherein the device die is molded in the molding compound. The package further includes a plurality of openings in the molding compound. Each of the conductive features is exposed through one of the plurality of openings. The plurality of openings has at least two horizontal sizes different from each other. A second package component is over the package and bonded to the conductive features through a plurality of solder regions, with portions of the plurality of solder regions extending into the plurality of openings.

In accordance with yet other embodiments, a method includes evaluating a first package component and the package to determine a warpage status of a combined package that comprises the first package component and the package, wherein the warpage status comprises a positive warpage and a negative warpage. The package includes a device die and a second package component, wherein the device die is bonded to a top surface of the second package component, and a polymer region molded on the top surface of the second package component, wherein the device die is molded in the polymer region. The method further includes forming a plurality of openings in the polymer region to expose conductive features on the top surface of the second package component. The step of forming the plurality of openings includes, in response to the positive warpage, making an inner one of the plurality of openings closer to a center of the package to have a smaller horizontal size than an outer one of the plurality of openings, and in response to the negative warpage, making an inner one of the plurality of openings closer to a center of the package to a greater horizontal size than an outer one of the plurality of openings.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a first package component comprising metal pads on a top surface of the first package component;
    a polymer region molded over the top surface of the first package component; and
    a plurality of openings, wherein each of the metal pads is exposed through one of the plurality of openings, and wherein the plurality of openings comprises:
        a first opening having a first horizontal size; and
        a second opening having a second horizontal size different from the first horizontal size, wherein each of the first opening and the second opening extends from a top surface of the polymer region to one of the metal pads, and the first horizontal size and the second horizontal size are measured in a direction parallel to the top surface of the polymer region, and the first horizontal size and the second horizontal size are measured at the top surface of the polymer region.

2. The device of claim 1, wherein the first horizontal size is greater than the second horizontal size, and wherein the first opening is closer to a center of the first package component than the second opening.

3. The device of claim 1, wherein the first horizontal size is smaller than the second horizontal size, and wherein the first opening is closer to a center of the first package component than the second opening.

4. The device of claim 1, wherein the first horizontal size is between about 50 percent and about 90 percent of the second horizontal size.

5. The device of claim 1 further comprising a device die bonded to the first package component and molded in the polymer region, wherein the first opening and the second opening are in a region outside of, and encircling, the device die.

6. The device of claim 1 further comprising a second package component bonded to the first package component through a plurality of solder-containing connectors, wherein each of the solder-containing connectors comprises a portion extending into one of the plurality of openings.

7. The device of claim 1, wherein in directions extending from a center of the first package component to edges of the first package component, horizontal sizes of the plurality of openings increase or decrease gradually.

8. The device of claim 5 wherein the plurality of openings is physically spaced apart from the device die.

9. The device of claim 1, wherein an entirety of each of the plurality of openings is in the polymer region.

10. The device of claim 1, wherein sidewalls of the polymer region are exposed to the plurality of openings.

11. The device of claim 1, wherein the metal pads comprises a first metal pad and a second metal pad, with the first opening and the second opening extending from the top surface of the polymer region to the first metal pad and the second metal pad, respectively, and wherein top surfaces of the first metal pad and the second metal pad are substantially coplanar with each other.

12. A device comprising:
a first package component comprising a plurality of conductive features at a surface;
a device die bonded to a top surface of the first package component;
a molding compound molded on the top surface of the first package component, wherein the device die is molded in the molding compound;
openings in the molding compound, wherein the openings are aligned into a plurality of rings encircling the device die, wherein the openings in each of the plurality of rings have a same horizontal size, and the openings in different ones of the plurality of rings have different horizontal sizes, wherein the horizontal sizes of the openings are measured in a direction parallel to the top surface of the molding compound, and the horizontal sizes of the openings are measured at the top surface of the molding compound;
solder regions filling the openings, wherein each of the solder regions extends from a top surface of the molding compound to contact one of the plurality of conductive features of the first package component; and
a second package component over and bonded to the first package component through the solder regions.

13. The device of claim 12, wherein outer ones of the plurality of rings encircle inner ones of the plurality of rings, and wherein the horizontal sizes of the outer ones of the plurality of rings are smaller than the horizontal sizes of the inner ones of the plurality of rings.

14. The device of claim 13, wherein the first package component and the second package component have a negative warpage, with solder regions in the inner ones of the plurality of rings having heights smaller than solder regions in the outer ones of the plurality of rings.

15. The device of claim 12, wherein outer ones of the plurality of rings encircle inner ones of the plurality of rings, and wherein the horizontal sizes of the outer ones of the plurality of rings are greater than the horizontal sizes of the inner ones of the plurality of rings.

16. The device of claim 15, wherein the first package component and the second package component have a positive warpage, with solder regions in the inner ones of the plurality of rings having heights greater than solder regions in the outer ones of the plurality of rings.

17. The device of claim 12, wherein the openings in each of the plurality of rings have a horizontal size different from the horizontal sizes of the openings in all remaining ones of the plurality of rings.

18. The device of claim 12, wherein the plurality of conductive features are metal pads that have top surfaces substantially level with each other, wherein each of the top surfaces is in physical contact with a bottom surface of one of the solder regions.

19. The device of claim 12, wherein an entirety of each of the openings is in the molding compound.

20. The device of claim 12, wherein each of the solder regions extends from a first level higher than a top surface of the device die to at least a second level coplanar with a bottom surface of the device die.

* * * * *